(12) United States Patent
Lee

(10) Patent No.: US 7,833,898 B2
(45) Date of Patent: Nov. 16, 2010

(54) METHOD FOR MANUFACTURING RESISTANCE RAM DEVICE

(75) Inventor: Yu Jin Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 30 days.

(21) Appl. No.: 12/427,819

(22) Filed: Apr. 22, 2009

(65) Prior Publication Data

US 2010/0167462 A1 Jul. 1, 2010

(30) Foreign Application Priority Data

Dec. 30, 2008 (KR) ...................... 10-2008-0137336

(51) Int. Cl.
*H01L 21/4763* (2006.01)

(52) U.S. Cl. ..................................................... 438/618

(58) Field of Classification Search ........................ None
See application file for complete search history.

(56) References Cited

U.S. PATENT DOCUMENTS 7,492,635 B2 * 2/2009 Kim et al. .............. 365/185.17

| | | | |
|---|---|---|---|
| 2008/0002481 A1 * | 1/2008 | Gogl et al. ............. | 365/189.06 |
| 2008/0203469 A1 * | 8/2008 | Gruening-von Schwerin .... | 257/327 |
| 2009/0034355 A1 * | 2/2009 | Wang .................... | 365/230.01 |
| 2009/0085121 A1 * | 4/2009 | Park et al. .................. | 257/368 |
| 2010/0084741 A1 * | 4/2010 | Andres et al. ............... | 257/536 |

* cited by examiner

*Primary Examiner*—Charles D Garber
*Assistant Examiner*—Andre' C Stevenson
(74) *Attorney, Agent, or Firm*—Ladas & Parry LLP

(57) ABSTRACT

Manufacturing a resistance RAM device includes the steps of forming an insulation layer on a semiconductor substrate having a bottom electrode contact; etching the insulation layer to define a hole exposing the bottom electrode contact; depositing sequentially a bottom electrode material layer and a TMO material layer selectively within the hole; depositing a top electrode material layer within the hole and on the insulation layer in such a way as to completely fill the hole in which the bottom electrode material layer and the TMO material layer are formed; removing partial thicknesses of the top electrode material layer and the insulation layer to form a stack pattern comprising a bottom electrode, a TMO, and a top electrode.

9 Claims, 3 Drawing Sheets

METHOD FOR MANUFACTURING RESISTANCE RAM DEVICE

CROSS-REFERENCE TO RELATED APPLICATIONS

The present application claims priority to Korean patent application number 10-2008-0137336 filed on Dec. 30, 2008, which is incorporated herein by reference in its entirety.

BACKGROUND OF THE INVENTION

The present invention relates generally to a method for manufacturing a resistance RAM device, and more particularly, to a method for manufacturing a resistance RAM device, which can secure switching characteristics.

Memory devices can generally be classified as volatile random access memory (RAM), which requires power to maintain stored information, or nonvolatile read only memory (ROM), which can retain the stored state of inputted information even when power is interrupted. Examples of volatile RAM include dynamic RAM (DRAM) and an static (SRAM), and an example of nonvolatile ROM is a flash memory device such as electrically erasable and programmable ROM (EEPROM).

Typical DRAM devices are generally considered excellent memory devices; however, DRAM must have high charge storing capacity. In order to obtain a high charge storing capacity, the surface area of an electrode must be increased, thereby making it difficult to accomplish a high level of integration. Further, in a flash memory device two gates are stacked on each other. As a consequence, a high operation voltage is required relative to the power supply voltage; and therefore, a separate booster circuit is necessary for generating the voltage required for write and delete operations. This also in turn makes it difficult to accomplish a high level of integration.

With these constraints in mind, memory devices under development have faced demands for a simple configuration capable of accomplishing a high level of integration while retaining the desirable characteristics of non-volatile memory devices. Currently, memory devices considered as having potential as next-generation memory devices include phase change RAM, resistance RAM (hereinafter referred to as an "ReRAM"), and magnetic RAM.

Among these memory devices, the ReRAM device is a memory device realized by placing a binary transition metal oxide (hereinafter referred to as a "TMO"), capable of storing information according to two resistant states, between a bottom electrode and a top electrode. As an optional electric signal is applied to the TMO, the ReRAM device can store information by taking advantage of the characteristics of the TMO, in which the TMO can be changed from an off state where the TMO has high resistance to be "non-conductive" to an on state where the TMO has low resistance to be "conductive" and the reverse.

Such ReRAM device provides advantages in that an ReRAM exhibits the characteristics of a nonvolatile memory device, has a simple structure, and can be easily manufactured when compared to a typical RAM device and a flash memory device, since the ReRAM is configured by interposing the TMO between the bottom electrode and the top electrode.

However in conventional ReRAM devices, an ideal etching profile is not obtained in an etching process for forming patterns, and the sides of the top electrode tend to be etched to a great extent. This in turn causes a problem in that the switching characteristics of the ReRAM device are likely to deteriorate.

In detail, the on and off characteristics of the ReRAM are determined according to a filament path which is produced on the interface of the TMO. In this regard, if the area of the interface between the top electrode and the TMO decreases, the filament path in the on state is most likely reduced, whereby a switching margin decreases.

Accordingly, if the ideal etching profile is not obtained, and the sides of the top electrode are etched to a great extent when conducting etching for forming the top electrode and the TMO; the area of the interface between the top electrode and the TMO cannot but decrease. In particular, when the size of an ReRAM device is decreased, the areas of the TMO and the top electrode are decreased in comparison to the area of the bottom electrode; and therefore the conventional ReRAM device has a drawback in that switching characteristics cannot be secured.

SUMMARY OF THE INVENTION

An embodiment of the present invention is directed to a method for manufacturing an ReRAM device which can secure switching characteristics in spite of the decrease in the size of an ReRAM.

In one aspect of the present invention, a method for manufacturing a resistance RAM device comprises the steps of forming an insulation layer on a semiconductor substrate having a bottom electrode contact; etching the insulation layer to define a hole exposing the bottom electrode contact; depositing sequentially a bottom electrode material layer and a TMO material layer selectively at a bottom of the hole; depositing a top electrode material layer in the hole and on the insulation layer in such a way as to completely fill the hole in which the bottom electrode material layer and the TMO material layer are formed; and removing partial thicknesses of the top electrode material layer and the insulation layer to form a stack pattern comprising a bottom electrode, a TMO, and a top electrode.

Before the step of forming the insulation layer, the method further comprises the steps of forming a switching element on the semiconductor substrate; forming a plug on the switching element such that the plug is electrically connected to the switching element; forming a metal pad on the plug; and forming the bottom electrode contact on the metal pad such that the bottom electrode contact is electrically connected to the metal pad.

The bottom electrode contact is formed to a height in the range of 80~4,000 Å.

The hole is defined to have an aspect ratio in the range of 5:1~20:1.

The bottom electrode material layer and the top electrode material layer are formed of at least one of Ti, Ni, Al, Au, Ag, Pt, Cu and Cr.

The TMO material layer is formed of at least one binary transition metal oxide selected from MgO, ZnO, $TiO_2$, NiO, $SiO_2$, $Nb_2O_5$ and $HfO_2$.

The TMO material layer is formed of at least one perovskite-based material selected from PCMO and LCMO.

Formation of the bottom electrode material layer, the TMO material layer and the top electrode material layer is implemented through an IMP-PVD process.

After the step of forming the stack pattern of the bottom electrode, the TMO and the top electrode, the method further comprises the steps of forming a top electrode contact on the stack pattern to be connected with the top electrode; and forming a metal line on the top electrode contact.

DESCRIPTION OF SPECIFIC EMBODIMENT

Hereafter, a specific embodiment of the present invention will be described in detail with reference to the accompanying drawings.

FIGS. 1A through 1E are cross-sectional views shown for illustrating the processes of a method for manufacturing a resistance RAM device in accordance with an embodiment of the present invention. The method will be described below.

Figure 1A:
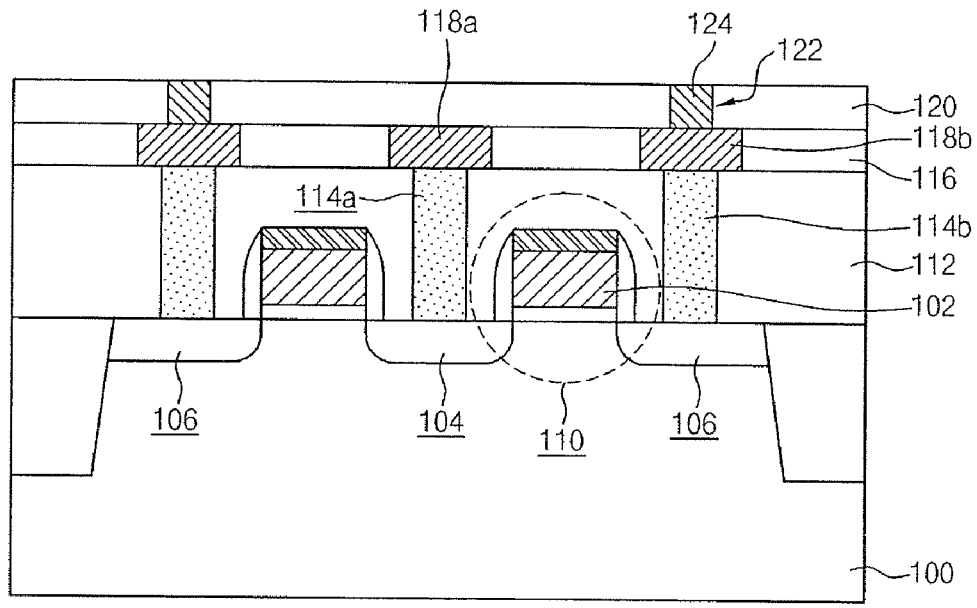
FIGS. 1A through 1E are cross-sectional views shown for illustrating the processes of a method for manufacturing a resistance RAM device in accordance with an embodiment of the present invention.

Referring to FIG. 1A, a switching element 110, which comprises a transistor including a gate 102, a source region 104 and a drain region 106, is formed on a semiconductor substrate 100. After forming a first interlayer dielectric 112 on the semiconductor substrate 100 to cover the switching element 110, first and second contact plugs 114a and 114b, which are electrically connected to the source region 104 and the drain region 106, respectively, are formed in the first interlayer dielectric 112 according to a process well known in the art.

After forming a first insulation layer 116 on the first interlayer dielectric 112 including on the first and second contact plugs 114a and 114b, a source line 118a and a metal pad 118b are formed in the first insulation layer 116 through, for example, a damascene process, in a manner such that the source line 118a is electrically connected to the source region 104 via the first contact plug 114a and the metal pad 118b is electrically connected to the drain region 106 via the second contact plug 114b.

A second insulation layer 120 is formed on the first insulation layer 116 including on the source line 118a and the metal pad 118b to a thickness in the range of 80~4,000 Å. Then, the second insulation layer 120 is etched in such a way as to expose the metal pad 118b to define a first hole 122, and a bottom electrode contact 124 is formed by filling the first hole 122 with a conductive layer. The bottom electrode contact 124 is formed by depositing a conductive layer using at least one of Ti, Ni, Al, Au, Ag, Pt, Cu, Cr or W to fill the first hole 122, and then chemically and mechanically polishing (CMPing) the conductive layer until the second insulation layer 120 is exposed. The bottom electrode contact 124 is formed to a height in the range of 80~4,000 Å, which corresponds to the thickness of the second insulation layer 120 as illustrated in FIG. 1A.

Figure 1B:
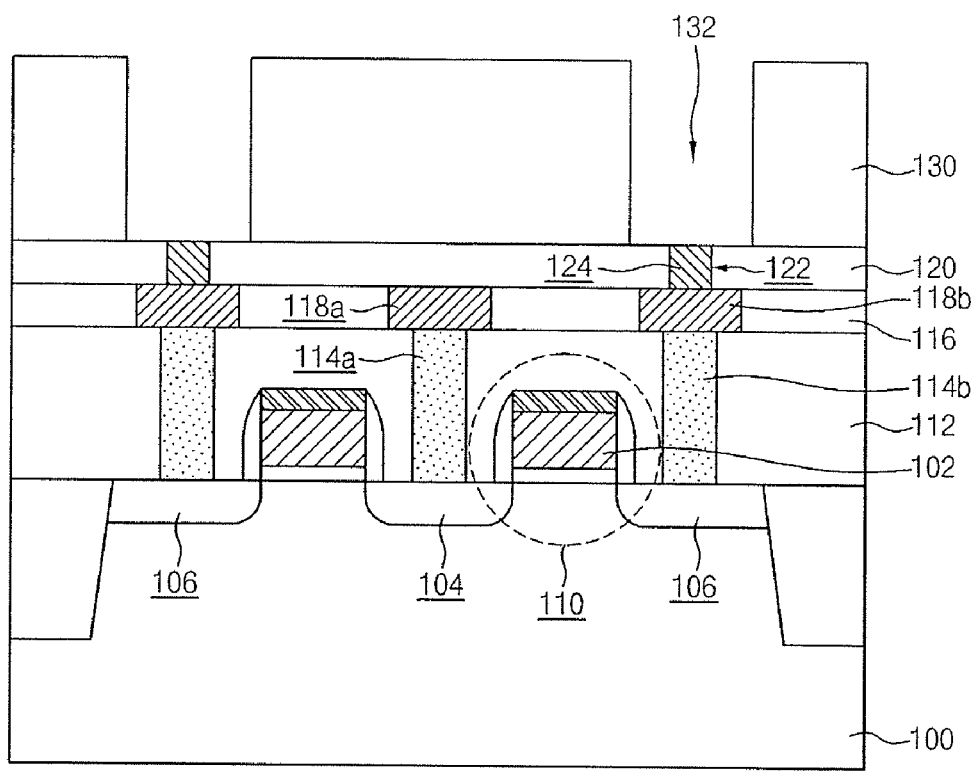

Referring to FIG. 1B, a second interlayer dielectric 130 is deposited on the second insulation layer 120 including on the bottom electrode contact 124. Next, a second hole 132 is defined by etching the second interlayer dielectric 130 in such a way as to expose the bottom electrode contact 124. The second hole 132 is defined to have an aspect ratio in the range of 5:1~20:1, and preferably, 10:1. That is to say, it is preferred that the second interlayer dielectric 130 be deposited in consideration of the size (that is, the diameter) of the second hole 132 which is defined subsequently, such that the thickness of the second interlayer dielectric 130 allows the second hole 132 to have an aspect ratio in the range of 5:1~20:1.

Figure 1C:
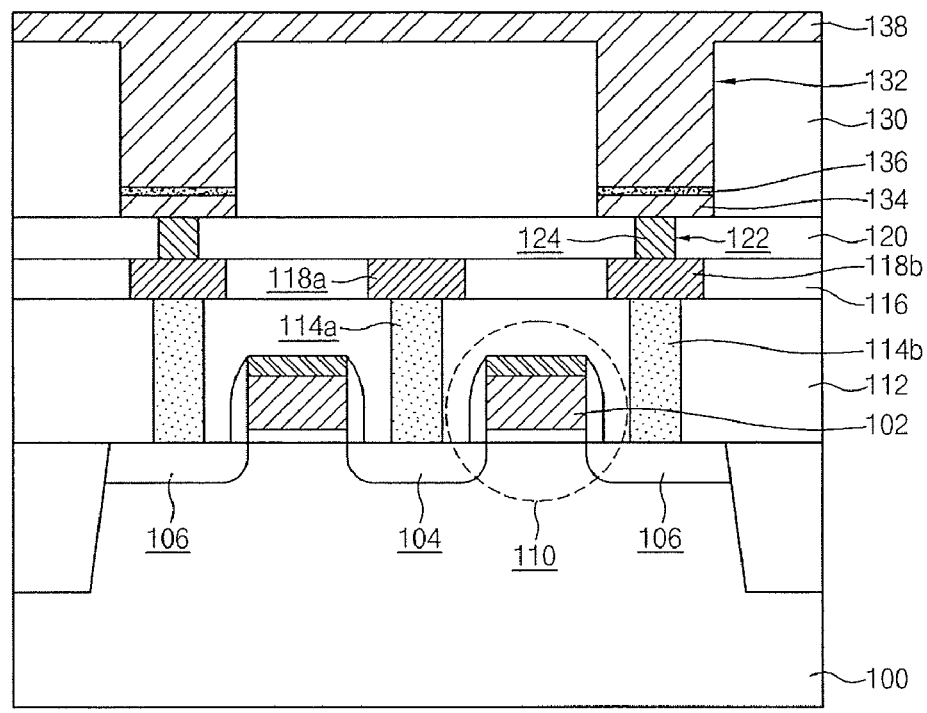

Referring to FIG. 1C, a bottom electrode material layer 134, a TMO material layer 136, and a top electrode material layer 138 are sequentially formed on the second interlayer dielectric 130 including the second hole 132. In an embodiment of the present invention, ionized metal plasma-physical vapor deposition (IMP-PVD) is used to sequentially form the bottom electrode material layer 134, the TMO material layer 136, and the top electrode material layer 138. Since the IMP-PVD has high directionality, the bottom electrode material layer 134 and the TMO material layer 136 are unlikely to be deposited on the sidewall of the second hole 132 and are mainly deposited on the bottom of the second hole 132 and on the second interlayer dielectric 130. In an embodiment of the present invention, process conditions are controlled such that the deposition of the bottom electrode material layer 134 and the TMO material layer 136 mainly occurs only on the bottom of the second hole 132.

The top electrode material layer 138 is deposited to a thickness allowing for the second hole 132 to be completely filled in consideration of a subsequent CMP process. Accordingly, the top electrode material layer 138 is deposited not only in the second hole 132 but also on the second interlayer dielectric 130, unlike the bottom electrode material layer 134 and the TMO material layer 136 which are mainly deposited on the bottom of the second hole 132.

The bottom electrode material layer 134 and the top electrode material layer 138 are formed by depositing at least one of Ti, Ni, Al, Au, Ag, Pt, Cu or Cr. In an embodiment of the present invention, the TMO material layer 136 is formed of a binary transition metal oxide such as MgO, ZnO, $TiO_2$, NiO, $SiO_2$, $Nb_2O_5$ and $HfO_2$ or using a perovskite-based material such as PCMO and LCMO.

Figure 1D:
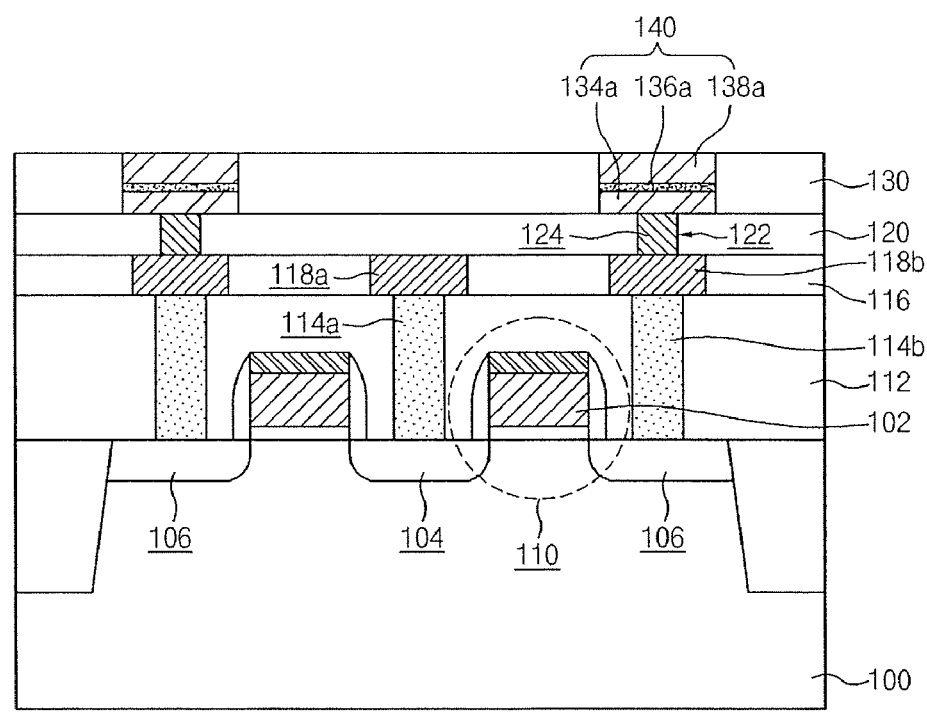

Referring to FIG. 1D, partial thicknesses of the top electrode material layer 138 and the second interlayer dielectric 130 are removed through a CMP process. Through this, a stack pattern 140 comprising a bottom electrode 134a, a TMO 136a and a top electrode 138a is formed.

In an embodiment of the present invention, since the stack pattern 140 of the bottom electrode 134a, the TMO 136a and the top electrode 138a is formed not by an etching process, but instead by the depositing process and the CMP process, it is possible to prevent the areas of the top electrode 138a and the TMO 136a from decreasing when compared to the bottom electrode 134a.

Accordingly, in the present invention, the area of the interface between the top electrode 138a and the TMO 136a can be secured. Specifically, even when the size of an ReRAM device is decreased, it is possible to prevent the area of the interface between the top electrode 138a and the TMO 136a from decreasing. Therefore, in the present invention, the switching characteristic of a completely manufactured ReRAM device can be secured.

Figure 1E:
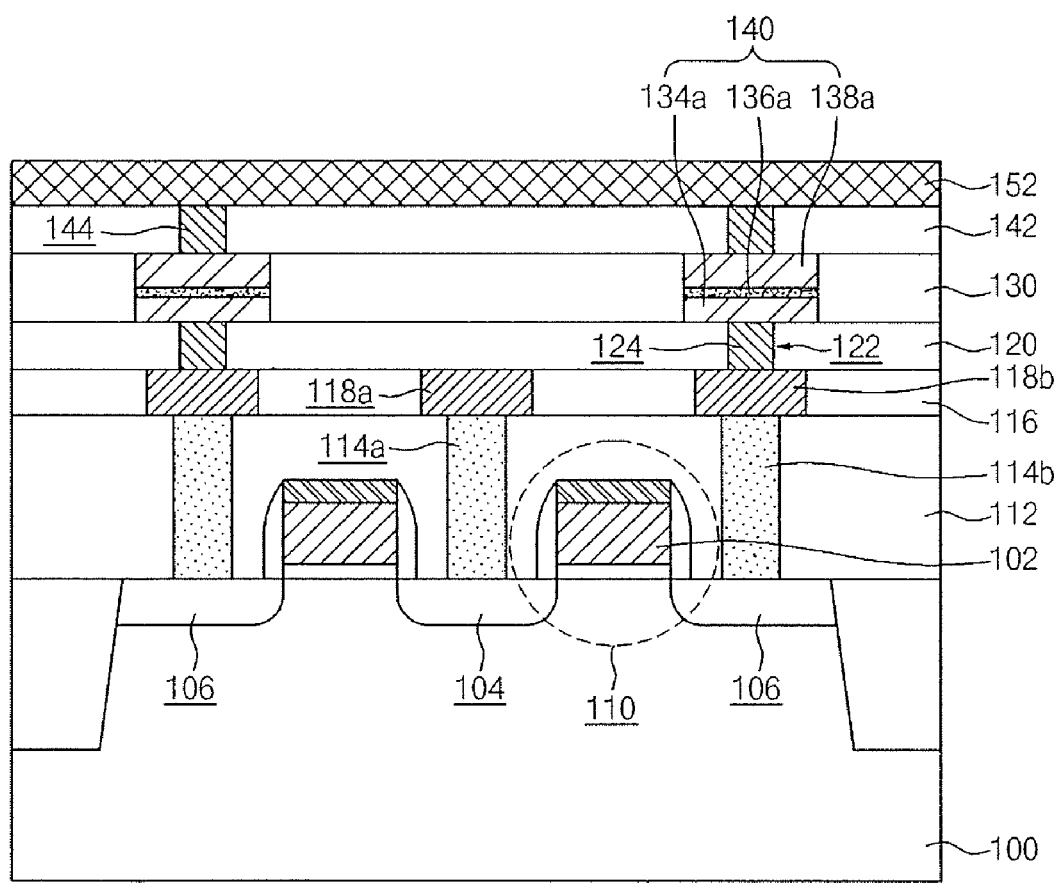

Referring to FIG. 1E, after forming a third interlayer dielectric 142 on the second interlayer dielectric 130 including on the stack pattern 140 comprising the bottom electrode 134a, the TMO 136a and the top electrode 138a; a top electrode contact 144 is formed in the third interlayer dielectric 142 through the same or similar process as the process for forming the bottom electrode contact 124. In an embodiment of the present invention, the material used for the top electrode 138a is the same as that of the bottom electrode contact 124. Next, after depositing a metal layer on the third interlayer dielectric 142 including the top electrode contact 144, a metal line 152 is formed by patterning the metal layer in such a way as to be connected to top electrode contacts 144, which are arranged in one direction.

Thereafter, while not shown in a drawing, by sequentially conducting a series of well-known subsequent processes, the manufacture of an ReRAM device according to the embodiment of the present invention is completed.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a resistance RAM device, comprising:
    forming an insulation layer on a semiconductor substrate having a bottom electrode contact;
    etching the insulation layer to define a hole exposing the bottom electrode contact;
    depositing sequentially a bottom electrode material layer and a TMO material layer selectively within the hole;
    depositing a top electrode material layer within the hole and on the insulation layer in such a way as to completely fill the hole in which the bottom electrode material layer and the TMO material layer are formed; and
    removing partial thicknesses of the top electrode material layer and the insulation layer to form a stack pattern comprising a bottom electrode, a TMO, and a top electrode.

2. The method according to claim 1, further comprising:
    before forming the insulation layer:
    forming a switching element on the semiconductor substrate;
    forming a plug on the switching element such that the plug is electrically connected to the switching element;
    forming a metal pad on the plug; and
    forming the bottom electrode contact on the metal pad such that the bottom electrode contact is electrically connected to the metal pad.

3. The method according to claim 2, wherein the bottom electrode contact is formed to a height in the range of 80~4,000 Å.

4. The method according to claim 1, wherein the hole is defined to have an aspect ratio in the range of 5:1~20:1.

5. The method according to claim 1, wherein the bottom electrode material layer and the top electrode material layer comprise at least one of Ti, Ni, Al, Au, Ag, Pt, Cu and Cr.

6. The method according to claim 1, wherein the TMO material layer comprises at least one binary transition metal oxide selected from MgO, ZnO, $TiO_2$, NiO, $SiO_2$, $Nb_2O_5$ and $HfO_2$.

7. The method according to claim 1, wherein the TMO material layer is formed of at least one perovskite-based material selected from PCMO and LCMO.

8. The method according to claim 1, wherein deposition of the bottom electrode material layer, the TMO material layer and the top electrode material layer is implemented through an IMP-PVD process.

9. The method according to claim 1, further comprising:
    after forming the stack pattern comprising the bottom electrode, the TMO, and the top electrode:
    forming a top electrode contact on the stack pattern such that the top electrode contact is electrically connected to the top electrode; and
    forming a metal line on the top electrode contact.

* * * * *